US010319601B2

(12) United States Patent
Arnepalli et al.

(10) Patent No.: US 10,319,601 B2
(45) Date of Patent: Jun. 11, 2019

(54) SLURRY FOR POLISHING OF INTEGRATED CIRCUIT PACKAGING

(71) Applicant: Applied Materials, Inc., Santa Clara, CA (US)

(72) Inventors: Ranga Rao Arnepalli, Veeravalli post (IN); Prerna Goradia, Mumbai (IN); Prayudi Lianto, Singapore (SG); Jie Zeng, Singapore (SG); Arvind Sundarrajan, Singapore (SG); Robert Jan Visser, Menlo Park, CA (US); Guan Huei See, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/467,866

(22) Filed: Mar. 23, 2017

(65) Prior Publication Data

US 2018/0277384 A1 Sep. 27, 2018

(51) Int. Cl.
| | |
|---|---|
| *H01L 21/3105* | (2006.01) |
| *H01L 21/3205* | (2006.01) |
| *C09G 1/02* | (2006.01) |
| *C09K 3/14* | (2006.01) |
| *C09G 1/00* | (2006.01) |
| *C09G 1/04* | (2006.01) |
| *C09G 1/06* | (2006.01) |
| *C09K 13/06* | (2006.01) |
| *B24B 1/00* | (2006.01) |
| *B24B 37/04* | (2012.01) |
| *H01L 21/306* | (2006.01) |

(52) U.S. Cl.
CPC .......... *H01L 21/31058* (2013.01); *B24B 1/00* (2013.01); *B24B 37/044* (2013.01); *C09G 1/00* (2013.01); *C09G 1/02* (2013.01); *C09G 1/04* (2013.01); *C09G 1/06* (2013.01); *C09K 3/1409* (2013.01); *C09K 3/1436* (2013.01); *C09K 3/1454* (2013.01); *C09K 3/1463* (2013.01); *C09K 13/06* (2013.01); *H01L 21/30625* (2013.01); *H01L 21/32051* (2013.01)

(58) Field of Classification Search
None
See application file for complete search history.

(56) References Cited

U.S. PATENT DOCUMENTS

| | | | |
|---|---|---|---|
| 5,919,548 A | * | 7/1999 | Barron ................ B81C 1/00611 |
| | | | 428/138 |
| 6,443,811 B1 | | 9/2002 | Nojo et al. |
| 7,071,105 B2 | * | 7/2006 | Carter .................... C03C 19/00 |
| | | | 257/E21.244 |

(Continued)

FOREIGN PATENT DOCUMENTS

| | | |
|---|---|---|
| JP | 2001-253709 | 9/2001 |
| WO | WO 2005/035688 | 4/2005 |
| WO | WO 2016/069244 | 6/2016 |

OTHER PUBLICATIONS

U.S. Appl. No. 15/508,359, filed Mar. 2, 2017.

*Primary Examiner* — Jiong-Ping Lu
(74) *Attorney, Agent, or Firm* — Fish & Richardson P.C.

(57) ABSTRACT

A slurry for chemical mechanical planarization includes water, 1-3 wt. % of abrasive particles having an average diameter of at least 10 nm and less than 100 nm and an outer surface of ceria, and ½-3 wt. % of at least one amine.

15 Claims, 5 Drawing Sheets

(56) References Cited

U.S. PATENT DOCUMENTS

| | | |
|---|---|---|
| 2003/0093957 A1 | 5/2003 | Feng et al. |
| 2005/0003744 A1 | 1/2005 | Feng et al. |
| 2005/0208882 A1 | 9/2005 | Cho et al. |
| 2006/0124594 A1 | 6/2006 | Lim et al. |
| 2006/0207188 A1 | 9/2006 | Paik et al. |
| 2009/0113809 A1 | 5/2009 | Sakai et al. |
| 2014/0209566 A1* | 7/2014 | Fu .................... C09G 1/02 216/53 |
| 2015/0104939 A1* | 4/2015 | Reiss ............ H01L 21/31053 438/693 |
| 2016/0001416 A1* | 1/2016 | Tsuchiya ........ H01L 21/02024 451/41 |
| 2017/0036317 A1* | 2/2017 | Davis ................ B24B 37/042 |
| 2017/0250091 A1* | 8/2017 | Yu ........................ H01L 21/56 |
| 2018/0043497 A1* | 2/2018 | Hanano ................ B24B 37/00 |

\* cited by examiner

SLURRY FOR POLISHING OF INTEGRATED CIRCUIT PACKAGING

TECHNICAL FIELD

The present invention relates generally to chemical mechanical polishing, and more particularly to polishing of packaging for integrated circuits.

BACKGROUND

An integrated circuit chip is typically "packaged" for use in a computing device, e.g., the semiconductor die with its microfabricated circuitry is enclosed in an assembly that both holds the chip and provides conductive lead lines that provide electrical connection, e.g., for a printed circuit board in the device, to the bond pads on the chip. The assembly can include a polymer shell, e.g., of polybenzobisoxazole (PBO), polyimide (PI) or Benzocyclobutene (BCB), that holds the chip. In addition, features formed of a metal, e.g., copper, can be embedded in the shell for the electrical connections. The metal features can be formed by photolithographic processes.

SUMMARY

In one aspect, a slurry for chemical mechanical planarization includes water, 1-3 wt. % of abrasive particles having an average diameter of at least 10 nm and less than 100 nm and having an outer surface of ceria, and about ½-3 wt. % of at least one amine.

Aspects may include one or more of the following features.

The slurry may consist of the water, the abrasive particles and the at least one amine.

The slurry may include 0.5-1.5 wt. % of tetramethylammonium hydroxide (TMAH). The slurry may consist of the water, the abrasive particles, the at least one amine, and the TMAH.

The abrasive particles may be about 2-3 wt. % of the slurry. The abrasive particles may consist of ceria. The abrasive particles may include a shell of ceria covering a core of a different oxide material. The different oxide may be silica or alumina.

The at least one amine may include methylamine or ethylamine. The slurry may include about 3 wt. % abrasive particles and about 0.8 wt. % methylamine.

The abrasive particles may be first abrasive particles, and the slurry may further include second abrasive particles having an outer surface of an oxide other than cerium oxide. The oxide may be an oxide of silicon or aluminum. A ratio of wt. % of the first abrasive particles to wt. % of the second abrasive particles may be 1:1 to 1:5. The abrasive particles may be first abrasive particles and may have an average diameter less than 30 nm, and the slurry may include second abrasive particles having an average diameter of at least 50 nm and an outer surface of ceria. The second abrasive particles may have an average diameter of at least 100 nm.

In another aspect, a method of fabricating packaging for an integrated circuit chip includes bringing a workpiece having an outer polymer layer into contact with a polishing pad, supply a slurry to an interface between the workpiece and the polishing pad, and generating relative motion between the workpiece and the polishing pad to polish the outer polymer layer. The slurry may include water, 1-3 wt. % of abrasive particles having an average diameter of at least 20 nm and less than 100 nm and having an outer surface of ceria, and ½-3 wt. % of at least one amine.

Aspects may include one or more of the following features.

The workpiece may include an inner polymer layer, a patterned metal layer, and the outer polymer layer may cover the inner polymer layer and the patterned metal layer. The metal layer may consist of copper. The outer polymer layer may be polished until a top surface of the workpiece is planarized. The outer polymer layer may be polished until an upper surface of the patterned metal layer is exposed.

A second metal layer may be deposited on the top surface and the second metal layer may be patterned. A further polymer layer may be deposited over the second metal layer and the further polymer layer may be planarized.

The outer polymer layer include polybenzobisoxazole (PBO) or polyimide (PI) or benzocyclobutene (BCB). The abrasive particles may be generated by a hydrothermal synthesis process.

Advantages may include optionally one or more of the following.

The polymer material of the packaging, e.g., PBO, can be polished at an increased polishing rate, e.g., a commercially viable polishing rate. The slurry can provide a high selectivity of the polymer material versus the conductive material, e.g., copper. For example, the selectivity can be greater than 100:1.

The surface of a packaging can be sufficiently planarized to permit photolithographic processes, or the ease or reliability of such photolithographic processes can be increased. Packaging can be provided that includes multiple layers of conductive lines. Yield of the manufacturing process for the packaging can be increased and manufacturing time can be decreased.

BRIEF DESCRIPTION OF DRAWINGS

Like reference symbols in the various drawings indicate like elements.

DETAILED DESCRIPTION

As chips become more complicated and the number of required connections increased and/or space for connections decreased, it becomes advantageous to vertically stack the conductive lead lines in multiple layers. That is, the packaging needs to include multiple layers of lead lines, with the different layers of lead lines vertically separated by the polymer material of the shell.

Figure 1:
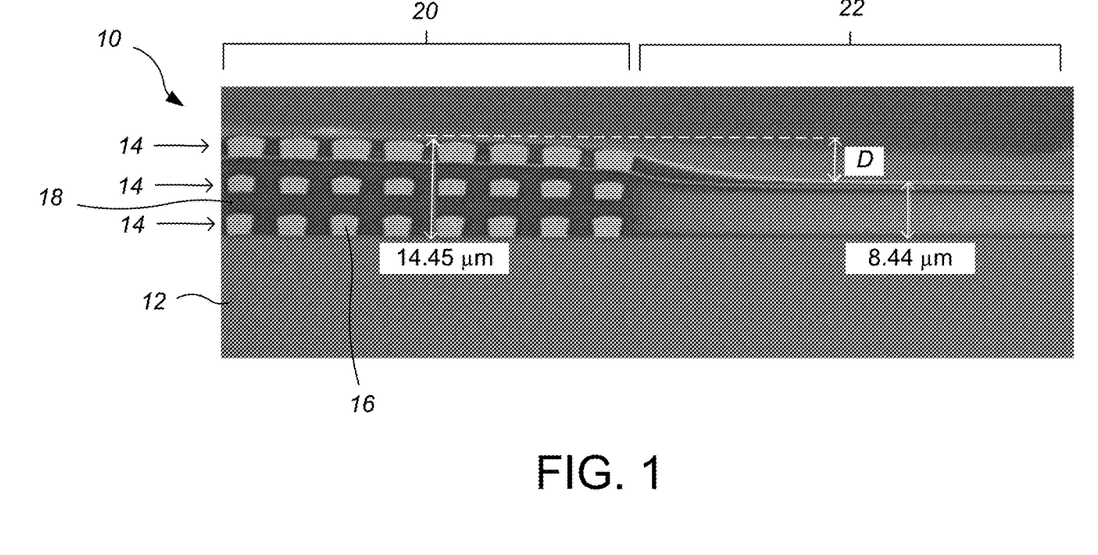
FIG. 1 illustrates a cross-section through packaging with multiple layers of conductive lines.

FIG. 1 illustrates a cross-section through a package 10 that includes a polymer base 12. The package 10 has a first region 20 in which metal features, e.g., metal lines, have been formed at high density over the polymer base 12, and a second region 22 which is relatively free of metal features. The region 20 can include multiple layers 14 of metal lines 16, with each layer 14 separated by a layer of polymer material 18.

To form such a device, a layer of the metal may be deposited and then patterned using photolithographic techniques to provide the metal features, e.g., the metal lines 16. Then an additional layer of polymer material 18 is deposited over the patterned metal features, e.g., to electrically insulate the metal features of one layer from the features on another layer. This process can be repeated for each additional layer 14 of metal features.

Unfortunately, as successive layers are built up, the thickness non-uniformity between different regions of the surface on which the conductive lines are to be formed can increase. For example, due to the presence of the metal features 16, the total thickness over the top surface of the body 12 is larger in the first region 20 than in the second region 22, resulting in a thickness difference D. If a sufficient number of layers are deposited, this thickness difference can exceed the depth of focus of the photolithography apparatus. As a result, the patterning fidelity is reduced, and depositing additional layers can run increasing risk of reduced yield.

Figure 2A:
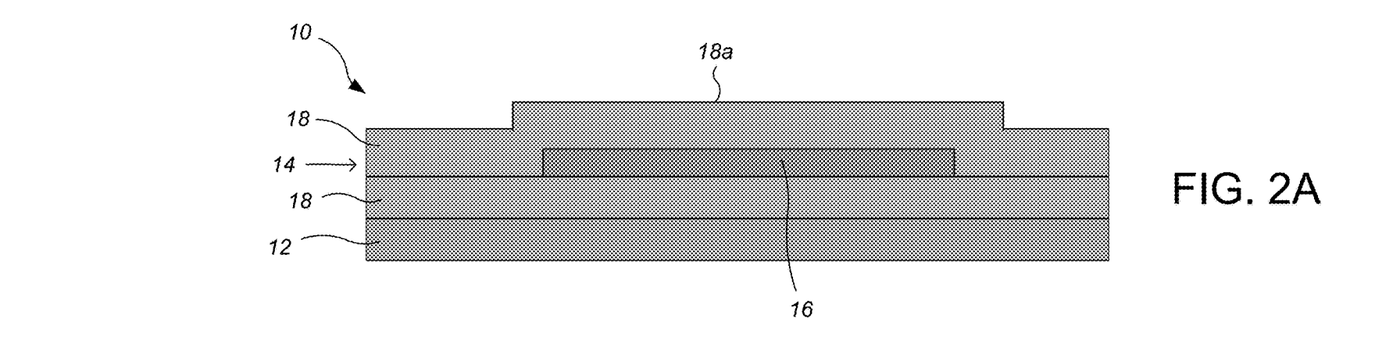
FIGS. 2A-2C illustrate a process of polishing packaging.
Figure 2B:
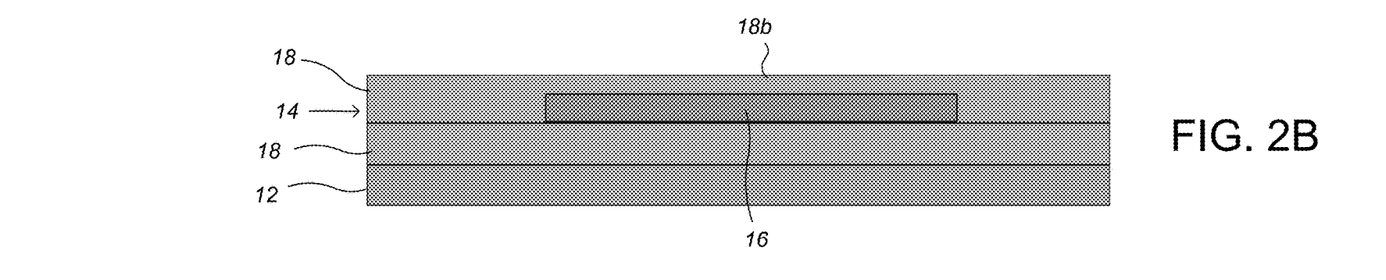
Figure 2C:
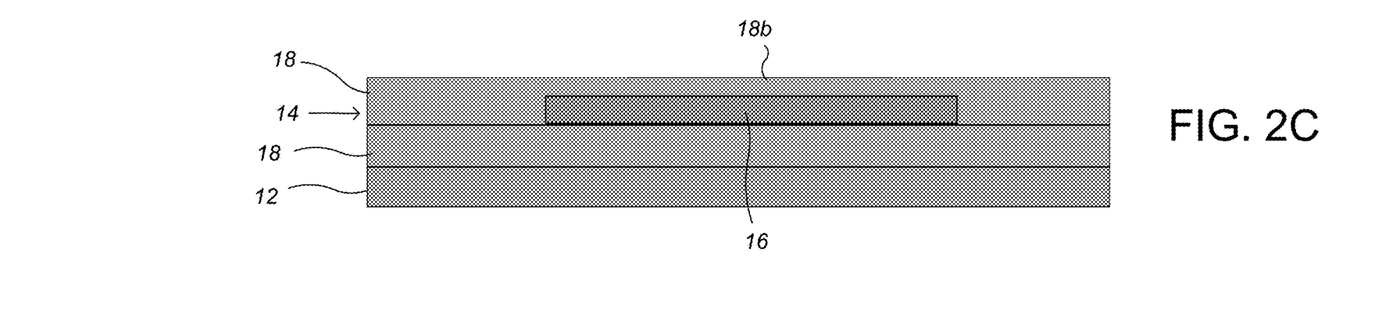

However, a technique to avoid this problem is to planarize each layer of polymer material 18 after it is deposited. For example, referring to FIGS. 2A-2C, the layer of polymer material 18 is deposited over the patterned metal features 16 to a sufficient depth that the thickness of the polymer material 18 in the region without features exceeds the height of the features 16. This leaves the layer of polymer material 18 with a non-uniform top surface 18a. This top surface is then planarized, leaving a top surface 18b that is substantially planar across both the regions with and without the metal features 16. Polishing can continue until the top surface of the metal feature 16 is exposed, leaving a planar top surface 18c. An additional layer 14 of metal features can then be fabricated on this planar top surface 18c at lower risk of incompatibility with the photolithography process.

Mechanical backgrinding is one proposed techniques to planarize the polymer material. However, backgrinding is not selective and is difficult and sensitive to processing conditions, leading to process instability and uncertain yield.

Chemical mechanical polishing (CMP) is an accepted method of planarization for semiconductor chips, but has not been commercially adopted for planarization of packaging. CMP typically requires that a substrate be mounted on a carrier head. The exposed surface of the substrate is typically placed against a rotating polishing pad. The polishing pad can have a durable roughened surface. A polishing liquid, e.g., abrasive slurry, is typically supplied to the surface of the polishing pad. The carrier head provides a controllable load on the substrate to push it against the polishing pad while the substrate and polishing pad undergo relative motion.

Unfortunately, commercially available slurries do not have acceptable characteristics for polishing of polymers, such as PBO and PI, that are used in packaging. In general, such slurries have a polishing rate that is too low (so that throughput is too low for commercial viability), have a polymer to metal polishing selectivity ratio that is too low, and are too expensive.

A slurry with promising characteristics for polishing of packaging material includes abrasive nanoparticles with a cerium oxide (ceria) surface, one or more amines, water, and optionally tetramethylammonium hydroxide (TMAH).

Table 1 summarizes the composition of the slurry:

TABLE 1

| SLURRY COMPONENT | WT. % OF SLURRY |
| --- | --- |
| Nanoparticles | 1-3 |
| Amine(s) | ½-3 |
| TMAH (optional) | ½-1½ |
| Water | |

Figure 3A:
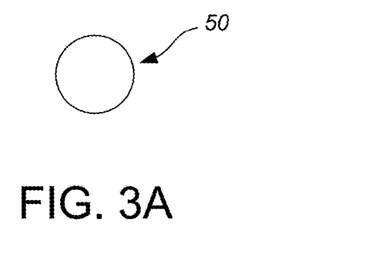
FIG. 3A is a schematic cross-sectional view of a nanoparticle.
Figure 3B:
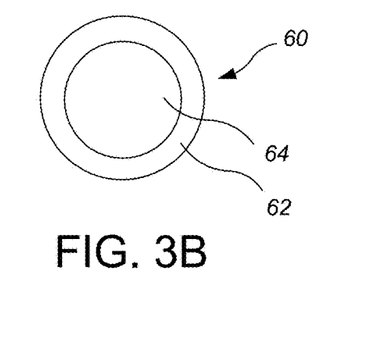
FIG. 3B is a schematic cross-sectional view of a nanoparticle that includes a core and a shell coating the core.

The abrasive nanoparticles have at least a layer at the surface that is ceria. As shown in FIG. 3A, in some implementations, the nanoparticles 50 consist of, i.e., are substantially pure, ceria. However, in some implementations the nanoparticles 60 have a shell 62 of ceria that coats a core 64 of a different material, e.g, a different oxide, such as silica or alumina.

The abrasive nanoparticles can have an average diameter of 10-150 nm, e.g., 10-100 nm. The nanoparticles can have an average diameter less than 100 nm, e.g., no more than 80 nm, e.g., no more than 50 nm, e.g., no more than 30 nm. The nanoparticles can have an average diameter of at least 10 nm, e.g., at least 15 nm, e.g., at least 20 nm.

In some implementations, e.g., where the nanoparticles consist of ceria, the nanoparticles have an average diameter of 15-50 nm, e.g., e.g., 20-30 nm. In some implementations, e.g., where the nanoparticles include a ceria shell coating a core of a different material, the nanoparticles can have an average diameter of 30-150 nm, e.g., 50-120 nm, e.g., 50-100 nm, e.g., 50-80 nm. For example, the nanoparticles can have a core that is about 30-100 nm, e.g., 30-80 nm, diameter, and a shell that is 2-20 nm thick. The abrasive particles can have a polydispersity index of less than 0.3.

The abrasive nanoparticles can be fabricated using a hydrothermal synthesis process, e.g., as described in PCT Publication No. WO2016/069244. Ceria particles produced by hydrothermal synthesis can have a more well-defined distribution of particle sizes in the nanometer range, such that a slurry including such ceria particles results in fewer defects in the substrate after polishing.

In terms of slurry contribution, the abrasive nanoparticles can be 1-3 wt. % of the slurry. In general, the higher the wt. % of the abrasive nanoparticles, the greater the polishing rate. However, above about 3 wt. %, abrasive nanoparticles agglomerate into large particles that fall out of the solution, rendering the slurry unusable for polishing. Thus, the abrasive nanoparticles should generally be as high a wt. % as practical without precipitating this agglomeration, e.g., 2-3%, e.g., 2½-3%, e.g., 3%.

Figure 4A:
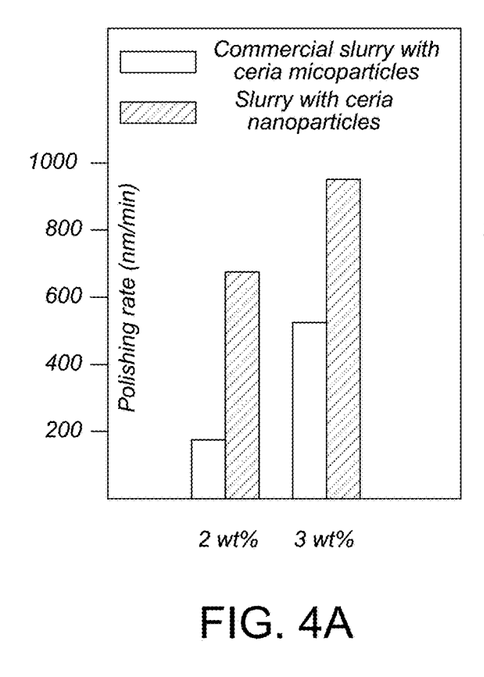
FIG. 4A is a graph illustrating PBO polishing rate for various slurries.

Referring to FIG. 4A, slurries using ceria nanoparticles exhibit a greater polishing rate for polymer, particularly PBO, relative to slurries that use conventional micron-sized ceria particles (commercial slurries have particle in sub-micron size to micron size, e.g., commercial ceria slurries have particle sizes of 100 nm or more). In particular, commercially available slurries using 2 wt. % and 3 wt. % of ceria microparticles were tested; they provided polishing rates of 180 nm/min and 520 nm/min respectively. In contrast, slurries using 2 wt. % and 3 wt. % of ceria nanoparticles provided polishing rates of 660 nm/min and 965 nm/min, respectively.

The increase in polishing rate of a polymer material as the concentration of ceria abrasive particles is increased above about 1 wt. % is actually unexpected; during polishing of SiO2 or SiN (conventional integrated circuit chip materials), an increase in wt. % in this range does not provide much change in the polishing rate. Without being limited to any particular theory, it is possible that in polishing of a polymer more interactions take place along the backbone of the polymer chain.

Figure 4B:
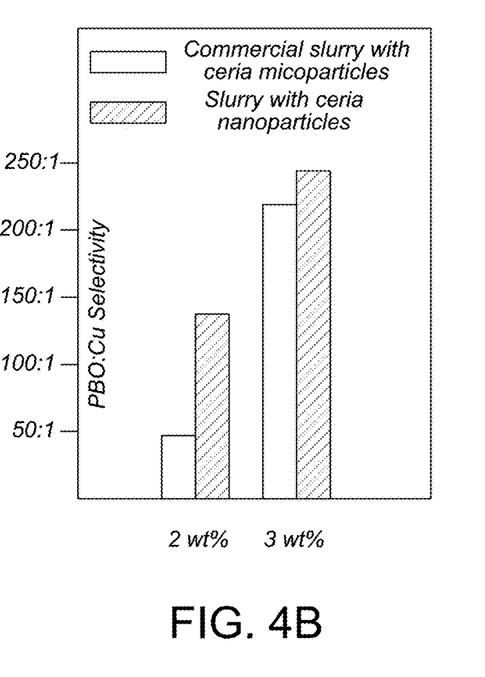
FIG. 4B is a graph illustrating PBO:Cu selectivity for various slurries.

Similarly, referring to FIG. 4B, slurries using ceria nanoparticles exhibit a superior selectivity of polishing of polymer over metal, particularly PBO over metal, relative to slurries that use conventional micron-sized ceria particles. Selectivity generally refers to the ratio of polishing rates of the two materials. In particular, commercially available slurries using 2 wt. % and 3 wt. % of ceria microparticles having average diameter of 100 nm or above were tested; they provided PBO:Cu selectivity of 45:1 and 130:1 respectively. In contrast, slurries using 2 wt. % and 3 wt. % of ceria nanoparticles provided PBO:Cu selectivity of 220:1 and 241:1 respectively.

The increased polishing selectivity for polymer materials of ceria nanoparticles as compared to ceria particles having an average diameter of 100 nm or more is also unexpected; the ceria particles do not exhibit such a change in selectivity for polishing of $SiO_2$ or SiN.

Without being limited to any particular theory, the presence of an amine in solution can adjust the zeta potential to provide an increased polishing rate. In general, the greater the difference between the charge on the wafer surface and the charge in the slurry, the higher the polishing rate should be. Having the slurry and polymer at opposite zeta potential, e.g., the slurry at a positive zeta potential and the polymer at a negative zeta potential, is advantageous in that it ensures attraction of the slurry particles to the polymer surface. But both the slurry and the polymer could have zeta potentials of the same sign if the difference is sufficiently large. In some implementations, the difference in the zeta potential is at least 10 mV, e.g., at least 15 mV, e.g., at least 20 mV. The practical maximum difference in the zeta potential is about 30-50 mV. In some implementations, the difference can be 10-20 mV.

The addition of methylamine or ethylamine adjusts the pH of the slurry to about 9 to 10, and sets the zeta potential of the slurry to about 5 to 7 mV. On the other hand, at pH of about 9 to 10, the zeta potential of PBO is about −8 to −6 mV, and the zeta potential of PI is about −10 to 11 mV. Because the zeta potential on the substrate surface is opposite to that of the slurry, the interaction of the substrate surface with the abrasives in the slurry increases, leading to a higher polishing rate. An additional pH adjuster, e.g., KOH, NaOH or TMAH, could be used to set the pH of the slurry.

As noted above, the slurry also includes one or more amines, e.g., methylamine, ethylamine, hydroxylamine or dimethylamine. The total amount of amine(s) in the slurry can be ½-3 wt. %, e.g., ¾-1½ wt. %. For example, the slurry may include 0.8 wt. % of ethylamine or 1.4 wt. % of methylamine. Addition of the amine also adjusts the pH of the slurry, e.g., from natural pH of 4.5 to a pH of about 9-10.

In some implementations, the slurry consists of the ceria nanoparticles, the one or more amines, and water. Thus, the slurry does not include other components such as an oxidizer, surfactant, etc. (except to the extent the ceria nanoparticles and amines already provide such functionality). This provides a slurry that is extremely simple to manufacture, and thus relatively low cost, while still being highly effective for polishing of polymers, e.g., PBO.

In some implementations, the abrasive particles can include a mixture of abrasive particles of different material compositions. For example, the abrasive particles can include some particles that are $CeO_2$, and some particles that are $SiO_2$ or $Al_2O_3$. Individual particles can be of homogenous composition. The abrasive particles can be present in a ratio of 1:1 to 1:5 of $CeO_2$ to $SiO_2$ or $Al_2O_3$. As an example, the slurry might have 1 wt. % CeO2 particles and 1-5 wt. % to $SiO_2$ or $Al_2O_3$ particles. The total wt. % of abrasive particles (of any kind) can be no more than 15 wt. %, e.g., no more than 10 wt. %. The slurry can consist of water, the two kinds of abrasive particles, and the at least one amine.

The use of a mixture of abrasive particles of different material compositions may be able to enhance the polishing rate on the polymer, although it might affect the selectivity for Cu slightly in comparison to the use of CeO2 alone. Without being limited to any particular theory, having abrasive particles of different material composition can increase the zeta potential of the slurry, e.g., to be greater than 15 mV.

In some implementations, the abrasive particles can include a mixture of abrasive particles of two different average sizes. For example, the slurry can include some abrasive particles that have diameters clustered around a value less than 30 nm, and other abrasive particles that have diameter clustered around a larger value, e.g., 50 nm or more, e.g., 100 nm or more, e.g., 200 nm. Provision of abrasive particles of different sizes can increase the removal rate. The slurry can consist of water, the two kinds of abrasive particles, and the at least one amine.

Techniques such as Raman spectroscopy, UV-VIS spectroscopy or fluorescence spectroscopy can be used to detect distinguishable peaks for different materials such as CeO2/Ce2O3; Ce4+/Ce3+ will give different characteristic absorption peaks. Different sized particles can also provide characteristic absorption peaks.

Optionally, the slurry can include tetramethylammonium hydroxide (TMAH). For example, the slurry can include 0.5-1.5 wt. % TMAH. On the one hand, slurry including TMAH exhibit higher polishing rates for PBO. On the other hand, TMAH is somewhat toxic. In some implementations, the slurry consists of the ceria nanoparticles (and optionally other abrasive particles as described above), the at least one amine, TMAH, and water.

Figure 5:
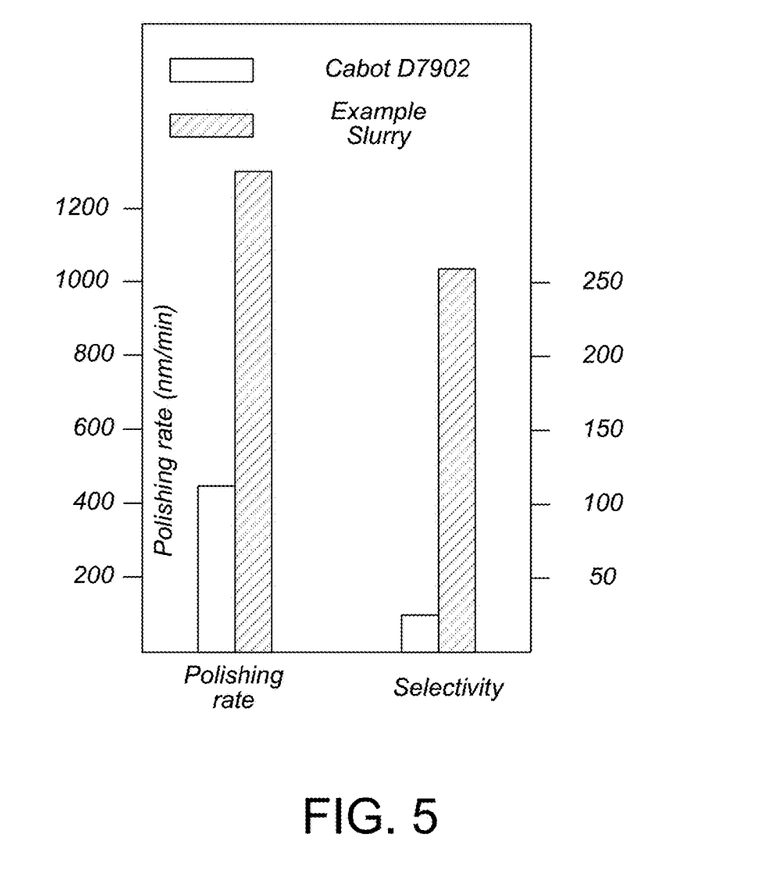
FIG. 5 is a graph comparing performance of a slurry described in the present application against a commercially available slurry.

FIG. 5 illustrates the overall performance of an example slurry that includes 3 wt. % of ceria microparticles and 0.8% of methylamine against the best-known commercially available slurry for chemical mechanical polishing of polymers, namely Cabot D7902. During polishing of PBO, the Cabot D7902 exhibited a polishing rate of 443 nm/min and a PBO:Cu selectivity of 22:1. In contrast, the example slurry, in otherwise the same polishing parameters, exhibited a polishing rate of 1300 nm/min and a PBO:Cu selectivity of 260:1.

Figure 6:
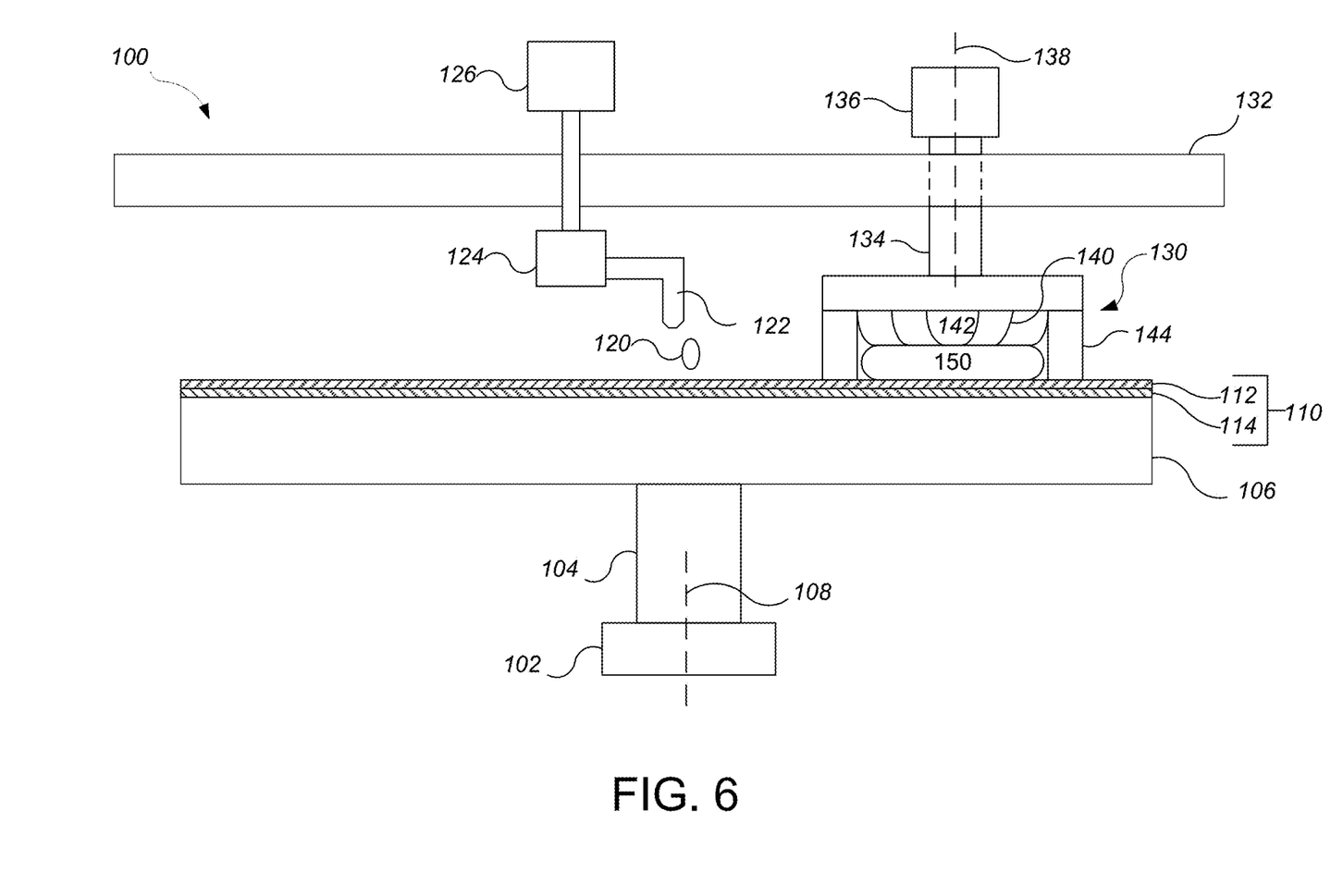
FIG. 6 is a schematic cross-sectional view of a polishing system.

FIG. 6 illustrates an example of a chemical mechanical polishing system 100 that can be used for polishing of packaging material. The polishing system 100 includes a rotatable disk-shaped platen 106 on which a polishing pad 110 is situated. The platen 106 is operable to rotate about an axis 108. For example, a motor 102 can turn a drive shaft 104 to rotate the platen 24. The polishing pad 110 can be a two-layer polishing pad with an outer layer 112 and a softer backing layer 114.

The polishing system 100 can include a supply port or a combined supply-rinse arm 122 to dispense a slurry 120 as described above, i.e., including abrasive nanoparticles with a cerium oxide (ceria) surface, an amine, water, and optionally TMAH, onto the polishing pad 110. In some implementations, a pump 124 is used to direct the slurry from a reservoir 126 to the supply port.

The polishing system 100 can include a pad conditioner apparatus with a conditioning disk to maintain the condition of the polishing pad.

A carrier head 130 is operable to hold a workpiece 150 of the packaging against the polishing pad 110. The carrier head 130 is suspended from a support structure 132, e.g., a carousel or a track, and is connected by a drive shaft 134 to a carrier head rotation motor 136 so that the carrier head can rotate about an axis 138. Optionally, the carrier head 130 can oscillate laterally, e.g., on sliders on the carousel or track 132; or by rotational oscillation of the carousel itself.

The carrier head 130 can include a flexible membrane 140 having a substrate mounting surface to contact the back side of the workpiece 150, and a plurality of pressurizable chambers 152 to apply different pressures to different zones, e.g., different radial zones, on the workpiece 150. The carrier head 130 can also include a retaining ring 154 to hold the workpiece below the membrane 140.

In operation, the platen 106 is rotated about its central axis 108, and the carrier head 130 is rotated about its central axis 138 and translated laterally across the top surface of the polishing pad 110.

However, the above described slurries can be used in a variety of polishing systems. Either the polishing pad, or the carrier head, or both can move to provide relative motion between the polishing surface and the substrate. The polishing pad can be a circular (or some other shape) pad secured to the platen, or a continuous or roll-to-roll belt.

In addition, in some implementations, the nanoparticles described above can be incorporated into a fixed-abrasive polishing pad rather than a slurry. Such a fixed abrasive polishing pad can include the nanoparticles embedded in a binder material. The binder material can be derived from a precursor which includes an organic polymerizable resin which is cured to form the binder material. Examples of such resins include phenolic resins, urea-formaldehyde resins, melamine formaldehyde resins, acrylated urethanes, acrylated epoxies, ethylenically unsaturated compounds, aminoplast derivatives having at least one pendant acrylate group, isocyanurate derivatives having at least one pendant acrylate group, vinyl ethers, epoxy resins, and combinations thereof. The binder material can be disposed on a backing layer. The backing layer can be a polymeric film, paper, cloth, a metallic film or the like.

In the case of the fixed-abrasive polishing pad, the workpiece can be polished in the presence of a polishing liquid that includes the remaining components of the slurry discussed above, i.e., one or more amines, optionally TMAH, and water.

Following polishing, the workpiece can be cleaned, e.g., by ultrasonic cleaning in a deionized (DI) water bath. In some implementations, the bath includes water and an organic complexing compound that is capable of forming a complex compound with ions of the abrasive particles that are left on the surface after polishing. The organic complexing compound can include one or more organic acids, e.g., a carboxylic acid, such as tartaric acid, citric acid, oxalic acid, lactic acid, or glyceric acid. As an example, the bath can be DI water with 2 wt. % citric acid.

By using internal $CeO_2$ slurries having an average particle diameter less than 100 nm, e.g., about 20-30 nm, after cleaning, the particles and defects (e.g., scratches) on the workpiece have been found to be reduced by 20%, relative to the commercial slurry (Cabot D7902).

In some implementations, numerical values for wt. % described above can be understood as including the term "about" before the numerical value for the wt. %.

A number of embodiments have been described. Nevertheless, it will be understood that various modifications may be made without departing from the spirit and scope of the disclosure. Accordingly, other embodiments are within the scope of the following claims.

What is claimed is:

1. A method of fabricating packaging for an integrated circuit chip, comprising:
    bringing an outer polymer layer of a workpiece into contact with a polishing pad, wherein the outer polymer layer is polybenzobisoxazole (PBO);
    supply a slurry to an interface between the workpiece and the polishing pad, wherein the slurry comprises water, 1-3 wt. % of abrasive particles having an average diameter of at least 20 nm and less than 100 nm and having an outer surface of ceria, and ½-3 wt. % of at least one amine, wherein the slurry consists of water, the abrasive particles and the at least one amine; and
    generating relative motion between the workpiece and the polishing pad to polish the outer polymer layer.

2. The method of claim 1, wherein the workpiece comprises an inner polymer layer, a patterned metal layer, and the outer polymer layer covers the inner polymer layer and the patterned metal layer.

3. The method of claim 2, wherein the metal layer consists of copper.

4. The method of claim 2, comprising polishing the outer polymer layer until a top surface of the workpiece is planarized.

5. The method of claim 4, comprising polishing the outer polymer layer until an upper surface of the patterned metal layer is exposed.

6. The method of claim 4, comprising depositing a second metal layer on the top surface and patterning the second metal layer.

7. The method of claim 6, comprising depositing a further polymer layer over the second metal layer and planarizing the further polymer layer.

8. The method of claim 1, comprising generating the abrasive particles by a hydrothermal synthesis process.

9. The method of claim 1, wherein the slurry comprises 2-3 wt. % of the abrasive particles.

10. The method of claim 1, wherein the slurry comprises 2½-3 wt. % of the abrasive particles.

11. A method of fabricating packaging for an integrated circuit chip, comprising:
    bringing an outer polymer layer of a workpiece into contact with a polishing pad, wherein the outer polymer layer is polybenzobisoxazole (PBO);
    supply a slurry to an interface between the workpiece and the polishing pad, wherein the slurry comprises water, 1-3 wt. % of abrasive particles having an average diameter of at least 20 nm and less than 100 nm and having an outer surface of ceria, ½-3 wt. % of at least one amine, and 0.5-1.5 wt. %, of tetramethylammonium hydroxide (TMAH), wherein the slurry consists of the water, the abrasive particles, the at least one amine, and the TMAH; and
    generating relative motion between the workpiece and the polishing pad to polish the outer polymer layer.

12. The method of claim 11, wherein the workpiece comprises an inner polymer layer, a patterned metal layer, and the outer polymer layer covers the inner polymer layer and the patterned metal layer.

13. The method of claim 12, wherein the metal layer consists of copper.

14. The method of claim 11, wherein the slurry comprises 2-3 wt. % of the abrasive particles.

15. The method of claim 11, wherein the slurry comprises 2½-3 wt. % of the abrasive particles.

* * * * *